(12) United States Patent
McDermott (10) Patent No.: US 6,227,685 B1
(45) Date of Patent: May 8, 2001

(54) ELECTRONIC WIDE ANGLE LIGHTING DEVICE

(76) Inventor: Kevin McDermott, 196 Phillips Dr., Hampstead, MD (US) 21074

( * ) Notice: Subject to any disclaimer, the term of this patent is extended or adjusted under 35 U.S.C. 154(b) by 0 days.

(21) Appl. No.: 08/728,937

(22) Filed: Oct. 11, 1996

(51) Int. Cl.$^7$ ....................................................... F21V 5/00
(52) U.S. Cl. ........................... 362/318; 362/255; 362/256; 362/800
(58) Field of Search .............................. 362/84, 255, 256, 362/318, 800

(56) References Cited

U.S. PATENT DOCUMENTS

| | | | |
|---|---|---|---|
| 4,009,394 | 2/1977 | Mierzwinski | 250/552 |
| 4,654,629 | 3/1987 | Bezos et al. | 340/87 |
| 5,211,469 | * 5/1993 | Matthias et al. | 362/800 X |
| 5,438,486 | * 8/1995 | McNair | 362/61 |
| 5,452,190 | * 9/1995 | Priesemuth | 362/255 |
| 5,803,579 | * 9/1998 | Turnbull et al. | 362/800 X |
| 5,899,557 | * 5/1999 | McDermott | 362/244 |

* cited by examiner

Primary Examiner—Stephen F. Husar
(74) Attorney, Agent, or Firm—Francis C. Hand; Carella, Byrne, B Gilfillan, Cecchi Stewart & Olstein (57) ABSTRACT

An electronic lighting device for use as a signal or illuminator. Light is created by a light emitting diode element which is encapsulated in a light transmitting medium. A curved exterior lens with a first radius of curvature is a first reference plane and a second and smaller radius of curvature in a normal plane cooperates with the location of the light emitting diode element to create a light beam with a controlled beam pattern which is elongated in a defined or first reference plane. The intensity of the projected light beam is maximized through the efficient collection of created light.

38 Claims, 3 Drawing Sheets

ELECTRONIC WIDE ANGLE LIGHTING DEVICE

BACKGROUND OF INVENTION

Many lighting devices are required to project their output light into beam patterns which are elongated in a defined plane commonly the horizontal plane—and shortened in a plane normal to the defined plane. A typical requirement would require a total beam spread of 10 degrees in the horizontal and 5 degrees in the vertical plane. In order to comply with these requirements optical systems must collect the light energy created by the device and direct it into the required beam pattern. It is usually impossible to redirect all the created light into the projected beam and some will be misdirected or lost. Improved designs reduce the percentage of created light that is lost.

Light emitting diode (LED) lamps for signaling application are being used in a number of lighting devices. The most common LED lamp is one with a cylindrical body and lens top. The lens collects and concentrates the light emitted by the light emitting diode element to form an intense output beam of light. The symmetry of the optics concentrate light both in the horizontal and vertical planes to an equal degree. Since many applications require elongated output light beams it is commonplace to group these discrete LED lamps in an elongated pattern within a lighting device to project the desired beam pattern. This design has a serious drawback in that the lens top LED lamp is very limited in its capacity to collect the light emitted by the diode element within its body. Generally, LED lamps that incorporate integral lenses to concentrate their light energy lose the ability to collect that light energy as the degree of concentration increases. Thus, although the lens top LED lamp produces concentrated output, it unfortunately fails to employ much of the energy being created.

Figure 4:
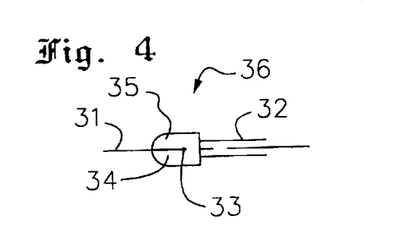
FIG. 4 is an illustrative view of a light emitting diode lamp with a lens top body.

Prior art design U.S. Pat. No. 4,654,629 issued to Bezos directs the output light beam from the lens top LED lamp into a secondary lens system. Although this is a workable design, it is deficient because most of the photometric energy has been lost before it can be captured by the secondary lens system. This lost energy is the result of unwanted refraction and internal reflection at the surface of the LED lamp. Additional prior art can be found in U.S. Pat. No. 4,009,394 issued to Mierzwinski. This device is a cylindrical lens for transmitting infrared light. It is an attempt to employ a greater percentage of the created light energy in the projected beam of an infrared transmitting device. It is constructed with a straight cylindrical lens surrounded by four reflective walls. Light from the infrared LED source which would otherwise be misdirected or lost is reflected from the reflective walls and contributes to the usable output energy. In order to reduce losses between the cylindrical lens and LED lamp "cap" which would occur "with air between different optical surfaces", the design bonds the "cap" to the lens. Although apparently successful for his purpose, the Mierzwinski patent would have little value for many lighting devices because the light collected is not controlled sufficiently to be directed into a projected beam pattern meeting a specification with limited vertical and/or horizontal beam spread. Cylindrical surfaces can effectively redirect light into a projected beam with a limited horizontal and/or vertical beam spread. However, meeting this objective requires both a definite and consistent relationship between the apparent or virtual point of emission of the light rays entering the lens and the foci of the lens surface. The Mierzwinski design discloses no consistency of relationship between the foci of the surface lens and the apparent point of emission of the light rays which enter it. Light reflecting from the walls of the Mierzwinski patent enter the cylindrical lens surface at a variety of angles and thus appear to originate from a multiplicity of sources from a plurality of locations each with a different geometrical relationship to the focal line. Furthermore, light created by the LED lamp which passes directly into the cylindrical lens surface will not be accurately redirected because the cylindrical surface has a focus line and the angular relationship and distance between the light source and focus line varies as one proceeds in the horizontal plane along the face of the lens. Therefore, the Mierzwinski design does not accurately control the relationship between the apparent or in his case the actual light source and the lens foci for light heading directly into the lens or for light entering the lens after reflection from the side walls. For this reason the design cannot efficiently produce the limited defined projected beam necessary for a signal device. Finally, light rays both reflected and direct which enter the cylindrical surface from other then along the axis of device experience different degrees of refraction due to the different lens contour they encounter. FIG. 4 of the patent is the sectional view of a vertical plane through the central axis and shows a curved lens surface 13. The shape of lens surface 13 would change if the vertical plane were angled from the central axis resulting in a change in the optical effect of that lens. Thus the Mierzwinski design would not achieve the control of the created light necessary for most signal devices because the created light rays experience a variety of lens contours depending upon their angle of divergence from the axis of the device.

SUMMARY OF INVENTION

A light emitting diode (LED) element is used in cooperation with a curved cylindrical surface and light transmitting medium to construct a device which concentrates a maximum amount of the created light into a beam pattern with a first beamwidth in a first reference plane and a second and smaller beamwidth in a plane normal to the first reference plane. The light emitting diode (LED) source is encapsulated within a light transmitting medium. The light transmitting medium extends to the exterior surface of the lighting device where it forms a contoured exterior surface. The exterior surface forms a first line shape when intersected by a first reference plane and a second line shape when intersected by a plane normal to the first reference plane. The first line shape and the location of the LED element cooperate to redirect light created by the LED element into a projected output beam pattern with a horizontal beamwidth usually equal to that required by the specification. The second line shape and the location of the LED element similarly cooperate to redirect light created by the LED element into a projected output beam pattern with a vertical beamwidth usually equal to that required by the specification. The fact that the typical required horizontal beamwidth exceeds the typical required vertical beamwidth permits the first line shape to be chosen to create less refraction resulting in reduced loss of light in the horizontal plane. The contoured exterior surface is optionally further shaped so that light rays entering it experience similar vertical refraction even if they impinge upon it from a variety of azimuthal angles. This consistent degree of refraction produces a consistent vertical beamwidth. The inclusion of a continuous light transmitting medium between the light source or LED element and exterior refracting surface deters refraction within the lighting device prior to the desired refraction at the exterior surface which would result in the apparent shifting or enlargement of the light source. Apparent shifting or enlargement of the light source would add to the misdirected light.

It is an object of the present invention to provide a lighting device that projects a light beam with an elongated beam pattern using an optical system including a curved exterior surface that optimizes the percentage of created light that contributes to that light beam. The optical system avoids unnecessary refraction because the radius of curvature of the contoured exterior surface is less in the first reference plane then it is in the plane normal to he first reference plane.

It is a further object of the invention to provide lighting device that projects a light beam with improved consistency in the horizontal and vertical beamwidths.

Another objective of this invention is to create a high intensity multi-lamp lighting device that projects an elongated beam pattern by combining a plurality of efficient single lamp lighting devices each which emits light with elongated projected beam patterns.

Another objective of this invention is to create a high efficiency multi-lamp lighting device which projects a beam pattern which is formed by superimposing the elongated projected beam patterns from a plurality of individual lighting devices.

DESCRIPTION OF THE PREFERRED EMBODIMENT

Figure 1:
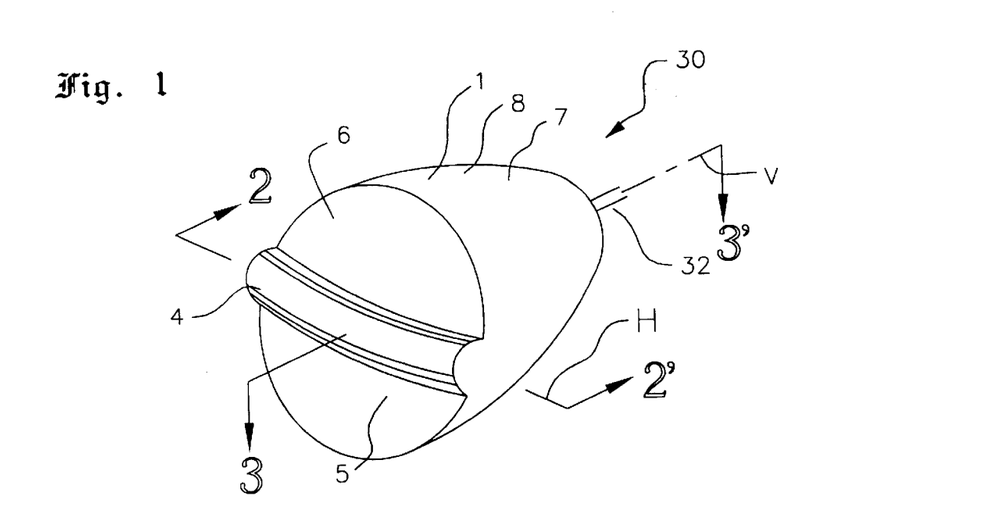
FIG. 1 is a perspective view of the preferred embodiment of the lighting device.

Referring to FIG. 1, lighting device 30 consists of an exterior light transmitting medium 1 forming a curved lens or central aperture surface 4, lower aperture surface 5, upper aperture surface 6 and side exterior surface 7 coated with a metallic finish to become reflector 8.

Figure 2:
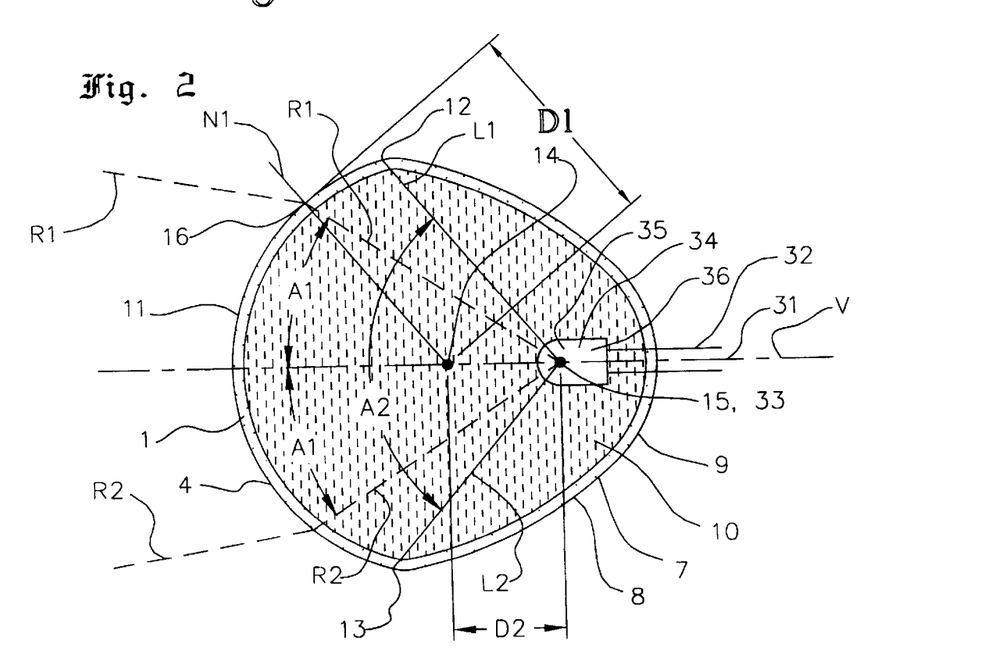
FIG. 2 is a sectional view of the FIG. 1 lighting device viewed along line 2-2' illustrating the horizontal optics.

FIG. 2 is a diagrammatic cross-sectional view of FIG. 1 taken in the horizontal plane viewed along line 2-2' of FIG. 1.

Figure 3:
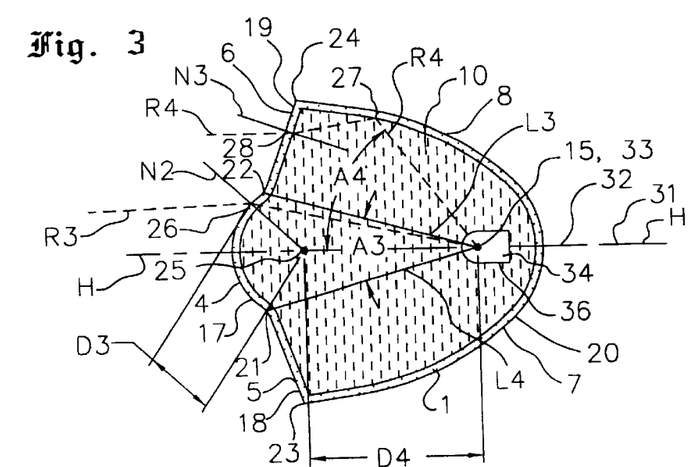
FIG. 3 is a sectional view of the FIG. 1 lighting device viewed along line 3-3' illustrating the vertical optics.

FIG. 3 is a diagrammatic cross-sectional view of FIG. 1 taken in the vertical plane viewed along line 3-3' of FIG. 1.

FIG. 4 is an illustration view of a light source 36 which includes LED element 33 electrical power leads 32 transparent body 34 with lens top 35. The geometric axis of transparent body 34 is coincident with the geometric axis of the spatial radiation pattern of the light emitted by LED element 33. This axis is line 31.

Figure 5:
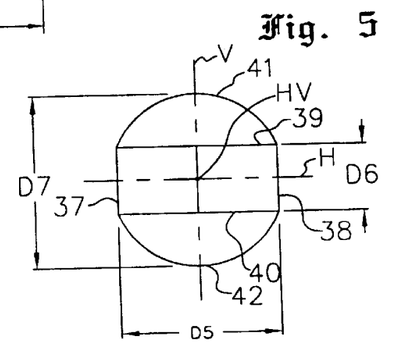
FIG. 5 is a view of the projected beam pattern from the FIG. 1 lighting device.

FIG. 5 is a typical beam pattern as projected on a surface at a defined distance from the FIG. 1 lighting device with horizontal plane H and vertical plane V intersecting at the point HV.

Referring to FIGS. 1 thru 5 and specifically, FIG. 2, the horizontal plane H viewed along line 2-2' of FIG. 1 intersects curved lens or central aperture surface 4 creating line or intersection 11 and reflector 8 creating line 9. Lines 11 and 9 intersect at points 12 and 13. Line 11 is circular with distance D1 equal to its radius of curvature and its center of curvature at point 14. Line 9 is elliptical with a focus at point 15. Light source 36 is located so that LED element 33 is positioned at focal point 15 and at distance D2 behind center of curvature point 14. Internal light transmitting medium 10 with an index of refraction substantially equal to that of external light transmitting medium 1 and transparent body 34 fills the interior thus completing a continuous optical path between LED element 33 and each of the aperture surfaces 4 thru 6. Typical light ray R1 emitted from LED element 33 at angle A1 relative to a first side of vertical plane V passes through body 34, lens 35, internal transparent medium 10 and exterior light transmitting medium 1 without refraction. It subsequently passes through central aperture surface 4 at point 16 whereupon it is refracted in accordance with classical optics relative to normal line N1. Light ray R1 emerges from central aperture surface 4 more parallel to vertical plane V as a result of the refraction. Light ray R2 emitted from LED element 33 at angle A1 relative to the second side of vertical plane V through refraction at central aperture surface 4, also becomes more parallel both to vertical plane V and light ray R1. If the degree of refraction is large enough typical light rays R1 and R2 emerge from central aperture surface 4 parallel to vertical plane V forming a concentrated beam of light. The degree of refraction depends upon several factors including the relationship between distances D1 and D2. If distance D2 is reduced to zero such that LED element 33 is located at center of curvature point 14, ray R1 originating from LED element 33 will pass through central aperture surface 4 along normal N1 and no refraction will occur. Other similar light rays will also experience no refraction. Spacing LED element 33 at a distance D2 from center of curvature 14 creates refraction at central aperture surface 4 which makes the refracted light rays more parallel and the projected light beam more intense. Unfortunately, spacing LED element 33 at any distance from center of curvature 14 reduces the efficiency of the lighting device and the larger the distance, the greater the loss in efficiency. The nature of the losses can be understood by considering reference lines L1 and L2 which connect LED element 33 to points of intersection 12 and 13 respectively. Lines L1 and L2 intersect to form included angle A2. Angle A2 is an indicator of the percentage of the total light created by LED element 33 that is collected by central aperture surface 4 along line 11. It can be seen that increasing distance D2 reduces angle A2 and thus reduces the percentage of created light that enters central aperture surface 4. Increasing distance D2 also causes additional losses relating to total internal reflection to be later described in FIG. 6.

In FIG. 3 vertical plane V viewed along line 3-3' of FIG. 1 intersects central aperture surface 4 creating line 17, lower aperture surface 5 creating line 18, upper aperture surface 6 creating line 19 and reflector 8 creating line 20. Lines 18 and 19 are straight, however, some designs may configure upper aperture surface 6 and lower aperture surface 5 to form curved lines to change the beam pattern. Line 17 intersects line 18 at point 21 and line 19 at point 22. line 20 intersects line 18 at point 23 and line 19 at point 24. Line 17 is circular with distance D3 equal to its radius of curvature and its center of curvature at point 25. Line 20 is elliptical with a focal point 15. Light source 36 is located—usually by casting in position—so that LED element 33 is positioned at focal point 15 and at distance D4 behind center of curvature 25. Internal light transmitting medium 10 fills the space between light source 36 and exterior light transmitting medium 1.

Reference lines L3 and L4 connect LED element 33 to points of intersection 22 and 21, respectively and intersect to form included angle A3 which is indicative of the percentage of total light created by LED element 33 that is collected by central aperture surface 4 along line 17. D4 is the distance between center of curvature point 25 and LED element 33. Typical light ray R3 passes from LED element 33 through first exterior surface 4 on line 17 at point 26 whereupon it is refracted relative to normal line N2 making it more parallel to the horizontal plane H. The relationship between the contour of line 17, distance D3 and distance D4 control the degree of refraction and can be selected so that ray R3 and all similar rays passing from LED element 33 directly through line 17 are refracted to emerge parallel to horizontal lens H. This concentrates all of the light emitted by LED element 33 within angle A3 into an intense projected beam substantially parallel to horizontal plane H with very small divergence in the vertical plane V. For some specifications this degree of concentration is required and we must accept the corresponding losses previously described. However, when specifications permit some divergence of the emerging light in the vertical plane then the distances D3 and D4 should be adjusted to minimize the refraction in order to minimize the losses. Generally, the projected light beam should be controlled so that its divergence is exactly what the specification requires for a particular plane. It is inefficient to first create a concentrated projected beam then employ a second optic to spread it out.

Since most specifications require an elongated beam pattern which permit limited divergence in the vertical plane and wider divergence in the horizontal plane, adjusting the optical characteristics of FIG. 2 provides us the greatest opportunity to improve the efficiency of the lighting device. The dimensions as shown in FIG. 2 should be adjusted so that the beam spread in the horizontal plane is as wide as permitted by the specification. If there is no specification limitation then the dimensions should be adjusted to reduce refraction. This avoids the unnecessary concentration of light which creates additional losses.

FIG. 3 also shows typical light ray R4 which because of its large angle of emission A4 relative to the horizontal plane H misses central aperture surface 4. It does, however, intersect and reflect from reflector 8 at point 27 whereupon it converges towards horizontal plane H. Subsequently, it intersects upper aperture surface 6 along line 19 at point 28 where it is refracted relative to normal N3 to emerge substantially parallel to horizontal plane H.

It should be noted that ray R4 which is typical of some light that would not be collected by central aperture surface 4 is collected and accurately directed into the same beam pattern formed by light emitted from central aperture surface 4. The contour of reflector 8, location of LED element 33, and position and tilt of upper aperture surface 6 all are selected to cooperate to produce a projected beam with a desired direction and divergence. A similar situation exists for lower aperture surface 5. Upper aperture surface 6 and lower aperture surface 5 usually are contoured to form curved lines of intersection when intersected by horizontal planes.

Light ray R4 travels a shorter distance than light ray R3 before each intersects their respective redirecting surface. This shorter distance makes it more difficult to redirect ray R4 into the required projected beam. This problem occurs because there are always minor variations in the location of the light source relative to its respective redirecting surface. There are also variations and imperfections in the contour of the redirecting surface. These variations change the direction at which a typical light ray intersects its redirecting surface and consequently change the direction of the light ray as it exits the lighting device. Also the larger the magnitude of the change in direction of the light ray as it exits the lighting device, the more likely that the ray will fail to add to the required beam pattern. Using basic principals of geometry and optics and assuming all other factors are equal, it can be seen that for a given variation in the relative location of the light source, the magnitude of the change in direction of a typical ray exiting the lighting device will be inversely related to the distance the light ray travels before it intersects its first redirecting surface. Thus for a given variation in the location of the light source, light ray R4 which travels a shorter distance then light ray R3 before it intersects its redirecting surface will experience a larger change in its direction as it exits the lighting device. Therefore, in this context redirecting surface central aperture surface 4 is superior to redirecting surface reflector 8 because for a given variation in source location its emitted light rays will not experience as large a degree of misdirection as those from reflector 8.

It is possible to replace elliptical reflector 8 with an alternate shape such as parabolic or hyperbolic as long as the location of LED element 33 and position and tilt of upper aperture surface 5 and lower aperture surface 6 are also adjusted to cooperate to produce the desired projected beam. The elliptical design described has an advantage in that its shape incorporates a smaller opening between points 23 and 24 and thus captures more of the created light. Reflector 8 may also be omitted for lower cost designs.

The current invention improves efficiency by increasing the percentage of the created light directed into the required beam pattern. It achieves this objective by minimizing refraction between the redirecting surfaces and LED element 33 thereby maintaining a calculated relationship between the virtual origin of the light and the focus of the optics in both the horizontal and vertical planes. The calculated relationship is selected to eliminate the unnecessary concentration or refraction of light. A physical and dimensional shape is selected which maintains the necessary calculated relationship between each light ray with due regard to its apparent point of emission, its angle of emission and the exterior surface it first interrupts. The relationship is maintained through the use of one or more light transmitting mediums which limit internal refraction which would shift or enlarge the virtual origin of the light rays thwarting the ability of the central aperture surface or reflector to accurately redirect them.

Generally, the larger the dimensions of the housing, the greater the control of the created light. Therefore in order to adequately control the created light for some difficult specifications it would not be unusual for light emitted by LED element 33 to pass through a 0.750 inch thickness of light transmitting medium before it exits the housing. Hence, selection of the light transmitting medium must be made with due regard to its transmission and absorption at the wavelength of the created light at the thickness of the design. Acrylic is a good choice for created light in the visible wavelengths because it has very low light absorption in thick sections.

Manufacturing problems can result from thick sections of the light transmitting medium and the shrinkage and distortion which accompany the casting process. Casting around a light source with a body reduces the maximum thickness and can ameliorate the casting problems. Other designs use liquid as the interior light transmitting medium. This eliminates casting the thick interior light transmitting medium and improves the transfer of heat away from the light source.

Also in lighting device 30, we have described a light source 36 which is a typical commercially available discrete LED lamp including a transparent body 34. It is sometimes desirable to construct lighting device 30 without a separate LED body 34 in order to eliminate losses at the interface of the LED body and interior light transmitting medium 10. In this case, interior light transmitting medium 10 would encapsulate LED element 33 directly.

Finally, external light transmitting medium 1 and internal light transmitting medium 10 can be one substance. This is beneficial because it totally eliminates optical surfaces or barriers between mediums which reduce overall transmission. It also avoids the possibility of slight differences in the indicies of refraction which can result in unwanted refraction and misdirected light.

FIG. 5 is the beam pattern projected on a surface at a distance from lighting device 30. The horizontal H and vertical V planes intersect at point HV which usually is the center of the required beam pattern. Lines 37 and 38 are separated by distance D5 which represents the outer contour lines of the elongated beam pattern in the horizontal plane projected from central aperture surface 4. As previously described, distance D5 can be controlled by adjusting distance D2 in FIG. 2. Similarly, lines 39 and 40 are separated by distance D6 which represents the outer contour lines of the shorter beam pattern projected from central aperture surface 4 in the normal plane which for the FIG. 1 configuration is the vertical plane. Distance D6 can be controlled by adjusting distance D4 in FIG. 3. Finally, lines 41 and 42 describe the contour of the beam pattern created by light rays reflected from reflector 8 which pass through lower aperture surface 5 and upper aperture surface 6. The distance D7 between lines 41 and 42 can be controlled by adjusting the relationship among lower aperture surface 5, upper aperture surface 6, reflector 8, and LED element 33. Usually it is desirable that distance D7 approach distance D6 making all of the reflected light fall within the specification requirement of a D6 vertical spread and a D5 horizontal spread.

Typical specifications for lighting devices require a maximum intensity at the center of the beam pattern at point HV of FIG. 5 and permit this intensity to decrease to a reduced percentage—usually 10 percent—of that maximum towards the outer edges at lines 37, 38, 39, and 40.

LED element 33 emits its energy with a spatial radiation pattern that include a central direction of high intensity and a gradient which decreases the intensity as one diverges from the central direction. Therefore, when LED element 33 is employed in a lighting device as described in FIGS. 1 thru 4, the projected light beam in the horizontal plane will have a high intensity at its center with a gradual decrease towards the edges of the beam pattern at lines 37 and 38. Hence LED elements naturally create their light energy with a spatial radiation pattern including a gradient similar to that required by typical commercial specifications. Conversely, a uniformly emitting light source such as an incandescent lamp would create a beam pattern with a substantially uniform intensity throughout the horizontal beam spread. This uniform beam pattern projects unnecessary light energy towards the edges of the beam pattern and therefore is inferior to the LED design when trying to comply with many typical commercial specifications.

If the specification requires an energy gradient different from the spatial radiation pattern of the LED element in a defined plane such as the horizontal plane, distance D2 of FIG. 2 can be adjusted. This will affect both the beamwidth and the intensity gradient of the projected beam pattern.

Figure 6:
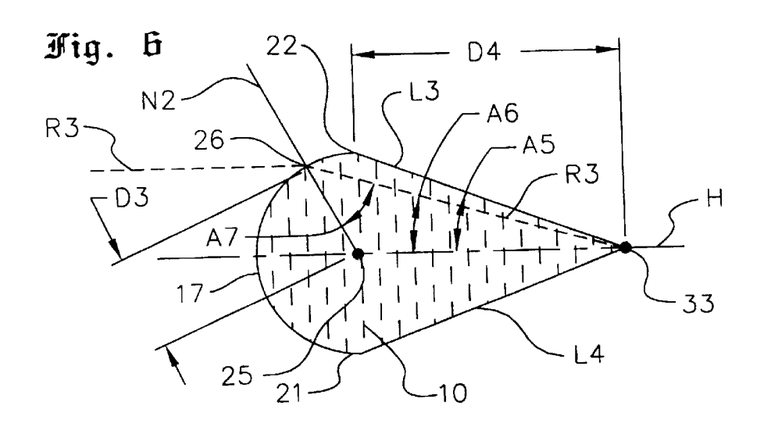
FIG. 6 is a detailed view of the central aperture or curved exterior surface of FIG. 3 demonstrating its optical characteristics.

FIG. 6 is a diagrammatic view of central aperture surface 4 of FIG. 3 detailing the optics which control the internal refraction of light for this type of design. Internal light transmitting medium 10 is shown as forming the entire housing replacing external light transmitting medium 1. This does not affect the optical analysis as both internal and external light transmitting mediums would have the same index of refraction and function optically as one substance. In this illustration, LED element 33 emits energy into interior light transmitting medium 10 towards line of intersection 17 or line 17 of central aperture surface 4. Curved line 17 has a radius of curvature equal to distance D3 and a center of curvature at point 25. Line L3 connects point 22 to LED element 33 and forms included angle A5 with horizontal plane H. Typical light ray R3 emitted from LED element 33 at angle A6 relative to horizontal plane H intersects line 17 at point 26, It also intersects normal N2 to line 17 forming angle A7 and is refracted relative to normal N2 to create refracted ray R3. Assuming an index of refraction for light transmitting medium 10 of 1.5 and an index of refraction of 1.0 exterior to line 17, it can be determined from basic optical principles that angle A7 cannot exceed a limited value without a large percentage of the light being internally reflected and thus fail to contribute to the projected beam pattern.

Additional analysis based upon the fact that angles A7 and A6 are part of a triangle connecting points 25, 26, and LED element 33 with the length of two of the legs of that triangle represented by distances D3 and D4 shows that angle A6 is limited. Hence all light emitted from LED element 33 at angles relative to horizontal plane H at angles greater than a limited angle will be substantially internally reflected. The problem can be ameliorated and the angle increased if distance D4 is reduced. Reducing distance D4 alone changes the ratio between distance D3 and D4 and the direction of refracted ray R3 making it less parallel to horizontal plane H. Thus decreasing the concentration or parallelism of refracted light rays emerging from central aperture surface 4 increases the percentage of light created by LED element 33 which can pass through central aperture surface 4. Usually, once a degree of concentration and an optical design is established, angle A5 is set to equal the angle of substantial internal reflection. This is done so that the mass of internal light transmitting medium 10 is reduced. It does not reduce efficiency because there is no benefit to a larger central aperture surface which does not refract additional light into the required beam pattern. The potential for improved efficiency relating to avoidance of internal reflection will also be employed in the optics of the horizontal plane as shown in FIG. 2. In fact, since the required beam pattern usually permits wider divergence in the horizontal plane. The potential for improved efficiency is usually greater in that plane.

Figure 7:
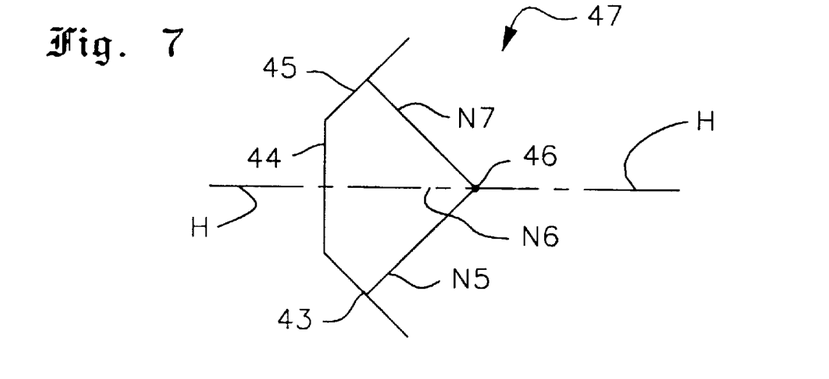
FIG. 7 is a diagrammatic view of the horizontal line of intersection of an alternate central aperture or exterior surface design which could substitute for the FIG. 2 contour.

FIG. 7 illustrates line 47 which could replace line 11 of FIG. 2 if an acceptable alternate shape for central aperture surface 4 were employed. In place of curved line 11 of FIG. 2, FIG. 7 shows line 47 formed of three straight segments 43, 44, and 45. These segments are angled so that their normals N5, N6 and N7, respectively, all converge and intersect at point 46 which is equivalent to center of curvature point 14 of FIG. 2. Using straight segments as indicated by line 47 tends to achieve one of the objectives of the preferred embodiment which strives to maintain a constant degree of refraction for all light rays that travel between LED element 33 and central aperture surface 4. Using additional straight segments to compose line 47 will further improve the ability to maintain the desired constant degree of refraction and an infinitive number of straight segments will result in a curved line similar to line 11 of FIG. 2. A central aperture surface contour which intersects a reference plane to form straight line segments in place of a curve can have advantages in that it can smooth out irregularities in the beam pattern caused by the light source or defects in the contour of the central aperture surface 4.

Figure 8:
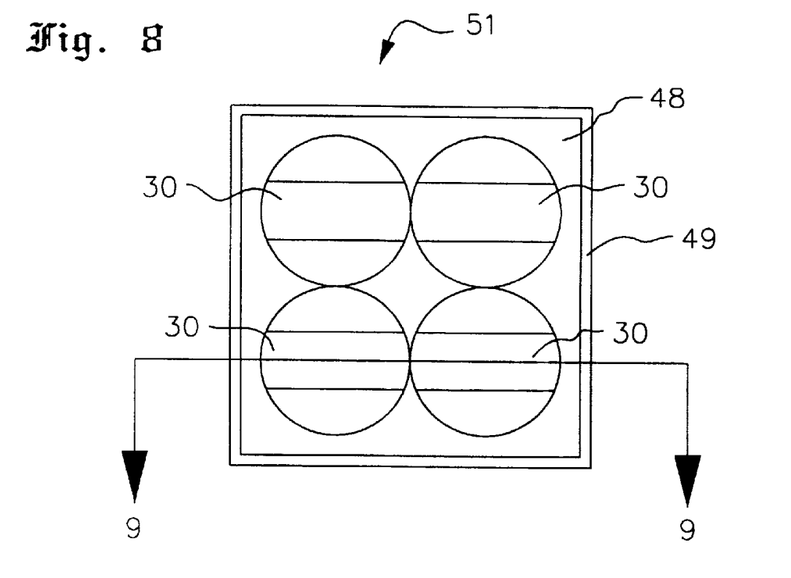
FIG. 8 is a front view of a lighting device which incorporates a plurality of the FIG. 1 lighting devices.
Figure 9:
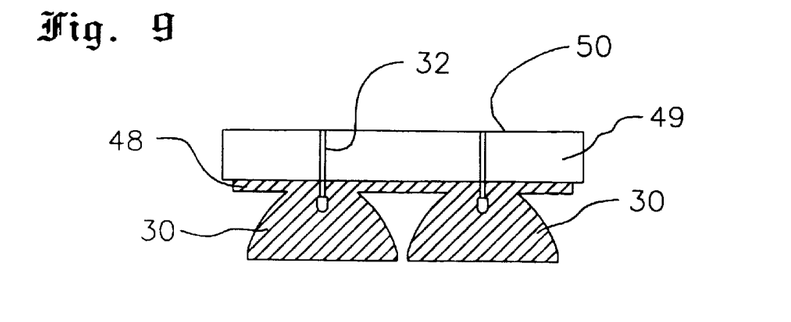
FIG. 9 is a sectional view of the FIG. 8 lighting device taken along line 9-9'.

FIG. 8 is an illustrational front view of a multi-lamp lighting device 51. FIG. 9 is a cross-section taken through line 9-9' of FIG. 8. In FIGS. 8 and 9, lighting device 51 incorporates four single lamp lighting devices similar to lighting device 30 of FIG. 1 molded into a single casting 48. Casting 48 can be formed from a single transparent substance which functions as both the internal and external light transparent mediums as described in FIG. 2. Casting 48 is attached to a printed circuit board 49 which has electrical circuit tracks 50 on its rear face. LED light sources similar to light source 36 of FIG. 3 can be molded in place inside of casting 48. The entire casting can then easily be soldered onto circuit board 49. The four lighting devices shown have identical orientations. This will create individual identically orientated beam patterns which at a distance overlay one another to form a composite projected beam pattern and thus increase the overall intensity of the device. Naturally other combinations or orientations can be used to meet specific beam pattern requirements. This design creates a higher intensity lighting device with an evenly lit face even at close distances because each of the component lighting devices projects light onto each section of the required beam pattern.

Having now fully set forth the preferred embodiments and certain modifications of the concept underlying the present invention, various other embodiments as well as certain variations and modifications of the embodiment herein shown and described will obviously occur to those skilled in the art upon becoming familiar with said underlying concept. For instance, although this disclosure centered on visible light, the concepts described and the term light are meant to include all electromagnetic radiated energy including the infrared portion of the spectrum.

It is to be understood, therefore, that within the scope of the appended claims, the invention may be practiced otherwise then as specifically set forth herein.

What is claimed is:

1. An electroluminescent wide angle lighting device including:
    a light source incorporating a light emitting diode element emitting light upon the application of electrical power, and;
    a circuit for the application of electric power to said light source, and;
    a housing including an exit aperture through which emitted light can pass, and;
    an exterior light transmitting medium with an index of refraction exceeding 1.25 located within said exit aperture forming at a first distance from said light emitting diode element a first exterior surface of said housing for refracting light passing through said exit aperture, and;
    an interior light transmitting medium with an index of refraction exceeding 1.25 extending from said exterior light transmitting medium to said light source, and;
    said first exterior aperture surface is further contoured so that it intersects a first reference plane passing through said light emitting diode element to form a first line which is a convex curve with a center of curvature located at said light emitting diode element, wherein;
    light rays emitted by said light emitting diode into said first reference plane towards said first line pass through said first exterior surface with minimal refraction, and;
    said first exterior aperture surface is further contoured so that it intersects a second reference plane normal to said first reference plane and passing through said light emitting diode element to form a second line which is a convex curve, and;
    the location of said light emitting diode element relative to said first exterior aperture surface and the contour of that surface cooperate such that light rays emitted by said light emitting diode element into said second reference plane towards said second line are refracted at said first exterior aperture surface to reduce their divergence, and;
    the maximum included angle between any two of all the possible straight lines that can be drawn between said light emitting diode element and said first line is greater than the maximum included angle between any two of all the possible straight lines that can be drawn between said light emitting diode element and said second line, wherein;
        said lighting device emits light with a projected beam pattern which at a defined distance has a first beamwidth in said first reference plane and a second beamwidth in said second reference plane, and;
        said second beamwidth is less than said first beamwidth.

2. An electroluminescent wide angle lighting device including:
    a light source incorporating a light emitting diode element emitting light upon the application of electrical power, and;
    a circuit for the application of electric power to said light source, and;
    a housing including an exit aperture through which emitted light can pass, and;
    an exterior light transmitting medium with an index of refraction exceeding 1.25 located within said exit aperture forming at a first distance from said light emitting diode element a first exterior surface of said housing for refracting light passing through said exit aperture, and;
    an interior light transmitting medium with an index of refraction exceeding 1.25 extending from said exterior light transmitting medium to said light source, wherein;
    said first exterior aperture surface is contoured so that it intersects a first reference plane passing through said light emitting diode element to form a first line, and;
    the location of said light emitting diode element relative to said first exterior aperture surface and the contour of that surface cooperate such that light rays emitted by said light emitting diode element into said first reference plane towards said first line are refracted at said first exterior surface to reduce their divergence, and;

said first exterior aperture surface is further contoured so that it intersects a second reference plane normal to said first reference plane and passing through said light emitting diode element to form a second line which is a convex curve, and;

the location of said light emitting diode element relative to said first exterior aperture surface and the contour of that surface cooperate such that light rays emitted by said light emitting diode element into said second reference plane towards said second line are refracted at said first exterior aperture surface to reduce their divergence, and;

the maximum included angle between any two of all the possible straight lines that can be drawn between said light emitting diode element and said first line is greater than the maximum included angle between any two of all the possible straight lines that can be drawn between said light emitting diode element and said second line, wherein;

said lighting device emits light with a projected beam pattern which at a defined distance has a first beamwidth in said first reference plane and a second beamwidth in said second reference plane, and;

said second beamwidth is less than said first beamwidth.

3. An electroluminescent wide angle lighting device including:

a light source incorporating a light emitting diode element emitting light upon the application of electrical power, and;

a circuit for the application of electric power to said light source, and;

a housing including an exit aperture through which emitted light can pass, and;

an exterior light transmitting medium with an index of refraction exceeding 1.25 located within said exit aperture forming at a first distance from said light emitting diode element a first exterior aperture surface of said housing for refracting light passing through said exit aperture, and;

an interior light transmitting medium with an index of refraction exceeding 1.25 extending from said exterior light transmitting medium to said light source, wherein;

said first exterior aperture surface is contoured so that it intersects a first reference plane passing through said light emitting diode element to form a first line, and;

a plurality of non-parallel reference planes drawn normal to said first reference plane, through said LED element and through said first exterior aperture surface each intersect said first exterior aperture surface to form a convex curved line, and;

each of said convex curved lines has a radius of curvature and a center of curvature, and;

for each convex curved line the quotient of a first distance between said LED element and its center of curvature divided by the sum of said first distance and the radius of curvature is substantially equal, and;

said lighting device emits light with a projected beam pattern which at a defined distance has a first beamwidth in said first reference plane and a second beamwidth in said second reference plane, and;

said second beamwidth is less than said first beamwidth.

4. An electroluminescent wide angle lighting device according to claims 1, 2 or 3 wherein;

said exterior light transmitting medium further forms a second exterior aperture surface and a concave surface of revolution, and;

a reflective coating is applied to said concave surface of revolution such that light emitted from said light source passes through said interior light transmitting medium then through said exterior light transmitting medium, subsequently, it is reflected at said reflective coating and redirected so that it passes through said second exterior aperture surface and impinges upon said projected beam pattern at said defined distance.

5. An electroluminescent wide angle lighting device according to claims 1, 2 or 3 wherein;

said exterior light transmitting medium further forms a second exterior aperture surface and an elliptical concave surface of revolution, and;

a reflective coating is applied to said concave surface of revolution such that light emitted from said light source passes through said interior light transmitting medium then through said exterior light transmitting medium, subsequently, it is reflected at said reflective coating and redirected so that it passes through said second exterior aperture surface and impinges upon said projected beam pattern at said defined distance.

6. An electroluminescent wide angle lighting device according to claims 1, 2 or 3 wherein;

said exterior light transmitting medium further forms a second exterior aperture surface and a parabolic concave surface of revolution, and;

a reflective coating is applied to said concave surface of revolution such that light emitted from said light source passes through said interior light transmitting medium then through said exterior light transmitting medium, subsequently, it is reflected at said reflective coating and redirected so that it passes through said second exterior aperture surface and impinges upon said projected beam pattern at said defined distance.

7. An electroluminescent wide angle lighting device according to claims 1, 2 or 3 wherein;

said light source further includes a transparent body which encapsulates said light emitting diode element.

8. An electroluminescent wide angle lighting device according to claims 1, 2 or 3 wherein;

said interior transparent medium is an acrylic plastic.

9. An electroluminescent wide angle lighting device according to claims 1, 2 or 3 wherein;

said interior transparent medium is a liquid.

10. An electroluminescent wide angle lighting device according to claims 1, 2 or 3 wherein;

said interior and said exterior transparent mediums are one substance.

11. An electroluminescent wide angle lighting device according to claims 1, 2 or 3 wherein;

said first distance exceeds 0.750 inch, and;

the transmissivity of said interior light transmitting medium exceeds 80 percent when measured through a thickness of 0.750 inch using light emitted by said LED element.

12. An electroluminescent wide angle lighting device according to claims 1, 2 or 3 wherein;

said first distance exceeds 0.750 inch, and;

the transmissivity of said exterior light transmitting medium exceeds 80 percent when measured through a thickness of 0.750 inch using light emitted by said LED element.

13. An electroluminescent wide angle lighting device according to claims 1, 2 or 3 wherein;
said defined distance is 60 feet.

14. An electroluminescent wide angle lighting device according to claim 3 wherein;
said first line consists of a plurality of intersecting line segments, and;
the normal lines drawn to each of said intersecting line segments converge upon said second reference plane.

15. A multi-lamp electroluminescent wide angle lighting device including:
a plurality of single lamp electroluminescent wide angle lighting devices each comprising a light source incorporating a light emitting diode element emitting light upon the application of electrical power, and;
a circuit for the application of electric power to each of said single lamp electroluminescent wide angle lighting devices, and;
each of said single lamp electroluminescent lighting devices further includes:
a housing including an exit aperture through which emitted light can pass, and;
an exterior light transmitting medium with an index of refraction exceeding 1.25 located within said exit aperture forming at a first distance from said light emitting diode element a first exterior surface of said housing for refracting light passing through said exit aperture, and;
an interior light transmitting medium with an index of refraction exceeding 1.25 extending from said exterior light transmitting medium to said light source, and;
said first exterior aperture surface is further contoured so that it intersects a first reference plane passing through said light emitting diode element to form a first line which is a convex curve with a center of curvature located at said light emitting diode element, wherein;
light rays emitted by said light emitting diode into said first reference plane towards said first line pass through said first exterior surface with minimal refraction, and;
said first exterior aperture surface is further contoured so that it intersects a second reference plane normal to said first reference plane and passing through said light emitting diode element to form a second line which is a convex curve, and;
the location of said light emitting diode element relative to said first exterior aperture surface and the contour of that surface cooperate such that light rays emitted by said light emitting diode element into said second reference plane towards said second line are refracted at said first exterior aperture surface to reduce their divergence, and;
the maximum included angle between any two of all the possible straight lines that can be drawn between said light emitting diode element and said first line is greater than the maximum included angle between any two of all the possible straight lines that can be drawn between said light emitting diode element and said second line, wherein;
light passing through said first exterior aperture surface forms a projected beam pattern which at a defined distance has a first beamwidth in said first reference plane and a second beamwidth in said second reference plane, and;
said second beamwidth is less than said first beamwidth.

16. A lighting device comprising
a light transmitting surface having a first line shape in a horizontal cross-sectional plane formed of three straight segments, each segment having a perpendicular bisector extending to a common point with the other of said segments;
a light emitting diode disposed on an axis passing through said common point; and
a light transmitting medium encapsulating said diode and extending to said light transmitting surface.

17. A multi-lamp electroluminescent wide angle lighting device comprising a plurality of lighting devices, each lighting device including a curved light transmitting cylindrical surface, a light emitting diode for directing light towards said cylindrical surface, and a light transmitting medium encapsulating said diode and extending to said curved cylindrical surface;
a casting mounting said lighting devices thereon; and
a printed circuit board on said casting and having a plurality of electrical circuit tracks, each track being electrically connected to a respective diode.

18. A lighting device as set forth in claim 17 wherein said curved surface has a first line shape in a first cross-sectional plane and a second line shape in a second cross-sectional plane normal to said first cross-sectional plane, said first line shape being located relative to said diode to redirect light from said diode into a projected output beam pattern with a first beam width in one plane and said second line shape being located relative to said diode to redirect light from said diode into a projected output beam pattern with a second beam width in a plane transverse to said first beam width and less than said first beam width.

19. A lighting device comprising
a light emitting diode;
a curved cylindrical light transmitting surface, said curved surface having a first line shape in a first: cross-sectional plane and a second line shape in a second cross-sectional plane normal to said first cross-sectional plane, said first line shape being located relative to said diode to redirect light from said diode into a projected output beam pattern with a first beam width in one plane and said second line shape being located relative to said diode to redirect light from said diode into a projected output beam pattern with a second beam width in a second plane transverse to said first beam wide and less than said first beam width; and
a light transmitting medium encapsulating said diode and extending to said curved surface.

20. A lighting device comprising
a curved cylindrical light transmitting surface, said curved surface having a curved aperture surface extending horizontally thereof, a lower aperture surface below said curved aperture surface and an upper aperture surface above said curved surface;
a light transmitting diode for directing light towards said surface; and
a light transmitting medium encapsulating said diode and extending to said curved surface.

21. A lighting device as set forth in claim 20 wherein said curved aperture surface has a radius of curvature in a vertical plane with a center of curvature on an axis passing through said diode and spaced from said diode.

22. A lighting device as set forth in claim 21 wherein said light transmitting surface has a developed elliptical exterior surface with a focal point on said axis passing through said diode and coincident with said diode.

23. A lighting device as set forth in claim 21 wherein said curved aperture surface has a radius of curvature in a horizontal plane with a center of curvature on said axis passing through said diode and spaced from said diode.

24. A multi-lamp electroluminescent wide angle lighting device comprising a plurality of lighting devices, each lighting device including a curved light transmitting surface, a light emitting diode for directing light towards said surface, and a light transmitting medium encapsulating said diode and extending to said curved surface and wherein each said curved surface has a curved aperture surface extending horizontally thereof, a lower aperture surface below said curved aperture surface and an upper aperture surface above said curved surface;

a casting mounting said lighting devices thereon; and a printed circuit board on said casting and having a plurality of electrical circuit tracks, each track being electrically connected to a respective diode.

25. A lighting device comprising at least one light emitting diode element for emitting light rays in an angularly divergent radiation pattern relative to a reference plane intersecting said light emitting diode element; and a light transmitting medium having an index of refraction exceeding 1.1, said medium having all exterior surface spaced from said light emitting diode element and comprising a first curved surface in said reference plane and a second curved surface in a plane transverse to said reference plane to receive and transmit light rays from said light emitting diode element, said second curved surface being of different curvature from said first curved surface.

26. A lighting device as set forth in claim 25 wherein said light transmitting medium encapsulates said light emitting diode element.

27. A lighting device as set forth in claim 25 having only one light emitting diode element.

28. A lighting device as set forth in claim 27 wherein said light transmitting medium encapsulates said light emitting diode element.

29. A multi-lamp lighting device comprising a plurality of lighting devices, each said lighting device including at least one light emitting diode element for emitting light rays in an angularly divergent radiation pattern relative to a reference plane intersecting said light emitting diode element, and a light transmitting medium having an index of refraction exceeding 1.1, said medium having an exterior surface spaced from said light emitting diode element comprising a first curved surface in said reference plane and a second curved surface in a plane transverse to said reference plane to receive and transmit light rays from said light emitting diode element, said second curved surface being of a different curvature from said first curved surface.

30. A multi-lamp lighting device as set forth in claim 29 wherein each respective light transmitting medium encapsulates said respective light emitting diode element.

31. A multi-lamp lighting device as set forth in claim 30 wherein said reference planets for at least two of said lighting devices are substantially parallel.

32. A multi-lamp lighting device as set forth in claim 30 wherein said exterior surface of each said lighting device is of a casting.

33. A multi-lamp lighting device as set forth in claim 30 wherein said first curved surface of each lighting device comprises a smaller radius of curvature than a radius of curvature of said second curved surface.

34. A multi-lamp lighting device as set forth in claim 30 wherein each said fighting device effects an elongated beam pattern.

35. A multi-lamp lighting device as set forth in claim 29 wherein said reference planes for at least two of said lighting devices are substantially parallel.

36. A multi-lamp lighting device as set forth in claim 29 wherein said exterior surface of each said lighting; device is of a casting.

37. A multi-lamp lighting device as set forth in claim 29 wherein said first curved surface of each lighting device comprises a smaller radius of curvature than a radius of curvature of said second curved surface.

38. A multi-lamp lighting device as set forth in claim 29 wherein each said lighting device effects an elongated beam pattern.

* * * * *